United States Patent
Suzuki (10) Patent No.: US 7,268,824 B2
(45) Date of Patent: Sep. 11, 2007

(54) METHOD AND APPARATUS FOR CANCELING JITTER

(75) Inventor: Noriyuki Suzuki, Kanagawa (JP)

(73) Assignee: Leader Electronics Corporation, Yokohama-shi (JP)

( * ) Notice: Subject to any disclaimer, the term of this patent is extended or adjusted under 35 U.S.C. 154(b) by 460 days.

(21) Appl. No.: 10/779,603

(22) Filed: Feb. 18, 2004

(65) Prior Publication Data

US 2004/0160530 A1   Aug. 19, 2004

(30) Foreign Application Priority Data

Feb. 19, 2003   (JP)   ............... 2003/041273

(51) Int. Cl.
*H04N 7/00* (2006.01)
*H04N 11/00* (2006.01)

(52) U.S. Cl. .................... 348/497; 327/158

(58) Field of Classification Search ........ 348/497–499, 348/512–520; 327/156, 157, 158
See application file for complete search history.

(56) References Cited

U.S. PATENT DOCUMENTS

| 4,313,135 A | * | 1/1982 | Cooper .................. 348/512 |
| 6,130,708 A | | 10/2000 | Kitagawa et al. |
| 6,275,265 B1 | * | 8/2001 | Kimura et al. ............ 348/536 |

FOREIGN PATENT DOCUMENTS

JP   11-215447   8/1999

* cited by examiner

*Primary Examiner*—Michael H. Lee
(74) *Attorney, Agent, or Firm*—Fish & Richardson P.C.

(57) ABSTRACT

A jitter canceling apparatus is provided for canceling jitter in a video signal. For processing a video signal, using as a reference an internal synchronization signal and an external synchronization signal different from the internal synchronization signal in the jitter canceling apparatus, an external synchronization signal generator generates the external synchronization signal from an external reference signal. A jitter detector detects time difference jitter, which is jitter in a time difference between the internal and external synchronization signals. The external synchronization signal generator controls the external synchronization signal generating operation in response to the detected time difference jitter to reduce the time difference jitter.

27 Claims, 12 Drawing Sheets

METHOD AND APPARATUS FOR CANCELING JITTER

BACKGROUND OF THE INVENTION

The present invention relates to the field of video signal processing associated with television signals and the like, and more particularly to a method and apparatus for canceling jitter in a video signal.

Conventionally, when a video signal processing apparatus, for example, a waveform display device such as a waveform monitor, receives an input video signal (or television signal) for displaying its waveform, the apparatus may use a synchronization signal received from the outside, which is different from a synchronization signal extracted from the received video signal. For example, in a studio involved in the production of television programs, a single reference signal is provided for synchronizing multiple video signal programs used in the studio with one another, such that the multiple video signal programs are synchronized with the reference signal. Conventionally, a technique has been known for generating a synchronization signal (or a trigger signal) for video signals from such an external reference signal (see, for example, Laid-open Japanese Patent Application No. 11-215447). A trigger generator circuit based on the technique described in Laid-open Japanese Patent Application No. 11-215447 employs either a PLL circuit for locking the phase to a vertical synchronization signal or a counter started by the vertical synchronization signal for generating a trigger signal, such that the trigger signal is generated at a horizontal scanning line period associated with the video signal type of a received video signal (interlace or non-interlace SDTV (Standard Definition Television signal) or HDTV (High Definition Television Signal)).

In the waveform display device employing the trigger generator circuit as described above, however, when an external trigger signal generated from the outside is switched to an internal trigger signal internally generated from an input video signal, and vice versa, a video signal can experience jitter in a frame period or a horizontal scanning line period.

SUMMARY OF THE INVENTION

It is therefore an object of the present invention to provide a jitter canceling method and apparatus for canceling jitter in a video signal.

It is another object of the present invention to provide a video signal processing apparatus which incorporates the jitter canceling method as mentioned above.

To achieve the above objects, according to a first aspect of the present invention, a jitter canceling method is provided for canceling video signal jitter in predetermined time periods of a video signal in processing of the video signal, using as a reference a first synchronization signal and a second synchronization signal different from the first synchronization signal. The method includes the steps of executing a second synchronization signal generating operation for generating the second synchronization signal from an external reference signal, detecting time difference jitter in a time difference between the first synchronization signal and the second synchronization signal, controlling the second synchronization signal generating operation in response to the time difference jitter to reduce the time difference jitter.

According to the present invention, the second synchronization signal generating operation may include the steps of generating a primitive second synchronization signal from the external reference signal, delaying the primitive second synchronization signal by a selected amount of delay to generate a delayed second synchronization signal, and matching the delayed second synchronization signal with the video signal in timing to generate the second synchronization signal. Also, the step of delaying may include generating a plurality of delayed second synchronization signals having different amounts of delay, and selecting one delayed second synchronization signal having a selected amount of delay from the plurality of delayed second synchronization signals.

Further, the step of matching the timing of the delayed synchronization signal and the video signal may use a reference clock derived from the video signal. In this case, the step of matching the timing of the delayed synchronization signal and the video signal may include sampling the delayed second synchronization signal based on the reference clock to generate a sampled synchronization signal, and generating the second synchronization signal which matches timing of the video signal based on the sampled synchronization signal.

Also, according to the present invention, the step of detecting time difference jitter may include detecting a phase difference of the second synchronization signal relative to the first synchronization signal at predetermined time periods, determining whether or not the phase difference is the same in two adjacent said predetermined periods to generate an unmatch signal when the phase difference is not the same, and counting the number of the unmatch signals to generate a delay selection signal for specifying the selected amount of delay in accordance with the result of the counting. In this case, the step of reducing time difference jitter may include the step of increasing or decreasing the selected amount of delay in response to the delay selection signal. The selected amount of delay may be increased or decreased each time a delay selection signal is received, by a predetermined unit delay. Also, the selected amount of delay may be initially set to be equal to zero.

Also, according to the present invention, the first synchronization signal may be an internal synchronization signal generated from the video signal under processing, and the second synchronization signal may be an external synchronization signal generated from the external reference signal. The synchronization signal may be used as a trigger signal.

To achieve the above objects, according to a second aspect of the present invention, a jitter canceling apparatus is provided for canceling video signal jitter in predetermined time periods of a video signal in processing of the video signal using as a reference a first synchronization signal and a second synchronization signal different from the first synchronization signal. The apparatus includes a synchronization signal generator receiving an external reference signal to generate a primitive second synchronization signal, a time difference jitter detector connected to receive the first synchronization signal and the second synchronization signal and detecting jitter in a time difference between the first and second synchronization signals to generate a time difference jitter signal indicative of the time difference jitter, a delay circuit connected to receive the primitive second synchronization signal and the time difference jitter signal and delaying the primitive second synchronization signal by a selected amount of delay in response to the time difference jitter signal to generate a delayed second synchronization signal, and a timing matching circuit generating from the delayed second synchronization signal the second synchronization signal which is matched with the video signal in timing.

According to the present invention the delay circuit may include delay signal generator generating a plurality of delayed second synchronization signals having different amounts of delay, and a selector connected to receive the plurality of delayed second synchronization signals and selecting one delayed second synchronization signal having said selected amount of delay from the plurality of delayed second synchronization signals. The plurality of delayed synchronization signals may be different one after another by a predetermined unit amount of delay. The delay means may include delay lines.

Also, according to the present invention, the timing matching circuit may use a reference clock derived from the video signal. The timing matching circuit may include a sampling circuit sampling the delayed second synchronization signal based on the reference clock to generate a sampled synchronization signal, and a generator generating the second synchronization signal matched with the video signal in timing based on the sampled synchronization signal. The selected amount of delay by which the primitive second synchronization signal is delayed may have a maximum of less than one period of the reference clock.

Further, according to the present invention, the time difference jitter detector may include a phase difference detector detecting a phase difference of the second synchronization signal relative to the first synchronization signal every predetermined time period, and a match detector determining whether or not the phase difference is the same in two adjacent said predetermined periods to generate an unmatch signal when the phase difference is not the same. The time difference jitter detector may further include a jitter reducing circuit counting the number of the unmatch signals to generate a delay selection signal for specifying the selected amount of delay in accordance with the result of the counting, thereby increasing or decreasing the selected amount of delay in response to the delay selection signal. The selected amount of delay may be incremented or decremented by a predetermined unit delay. The selected amount of delay may be initially set to be equal to zero.

Furthermore, according to the present invention, the first synchronization signal may be an internal synchronization signal generated from the video signal under processing, and the second synchronization signal may be an external synchronization signal generated from the external reference signal. The predetermined time period may be a frame period or a horizontal period. The synchronization signal may be a frame signal or a horizontal synchronization signal. The external reference signal may be a video signal of the same type as or different from the video signal. The processing of the video signal may include displaying the waveform of the video signal.

To achieve the above objects, according to a third aspect of the present invention, a video signal processing apparatus which includes the jitter canceling apparatus described above is employed. According to the present invention the video signal processing apparatus may be a waveform monitor.

DETAILED DESCRIPTION OF THE INVENTION

Figure 1:
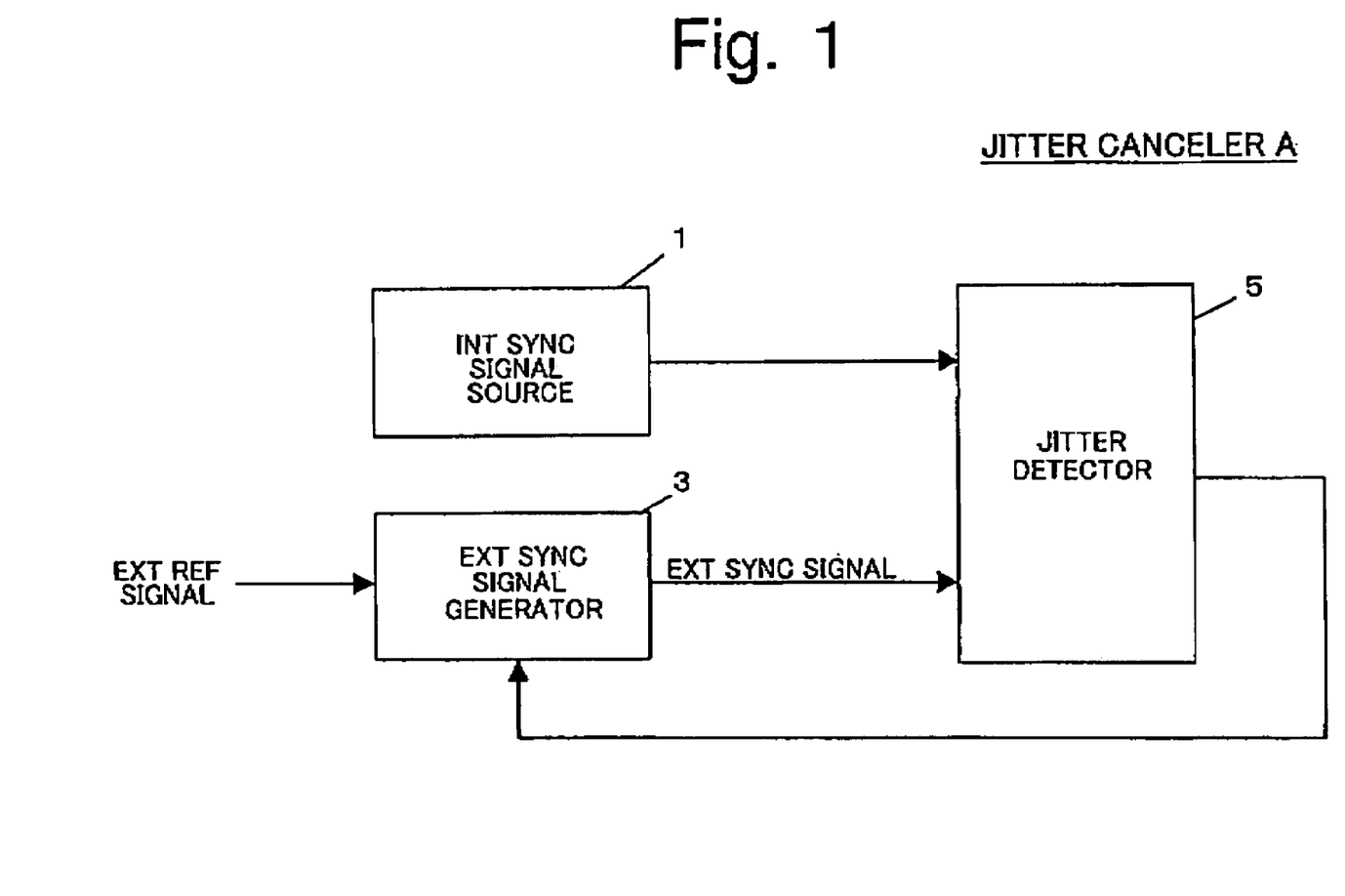
FIG. 1 is a block diagram illustrating a jitter canceler A according to an embodiment of the present invention.

FIG. 1 is a block diagram illustrating a jitter canceler A according to an embodiment of the present invention. As illustrated, the jitter canceler A comprises an internal synchronization signal source 1, an external synchronization signal generator 3, and a jitter detector 5. The internal synchronization signal source 1 is a circuit that provides an internal synchronization signal internally generated from a video signal processed in a system which incorporates the jitter canceler A. The source 1 has an output terminal for providing the internal synchronization signal generated thereby. The external synchronization signal generator 3 has a first input terminal for receiving an external reference signal different from the video signal under processing, and also has a second input terminal for receiving the output from the jitter detector 5. The generator 3 further has an output terminal for providing an external synchronization signal generated from the external reference signal for use with the video signal under processing. The external reference signal used herein may be a video signal of the same type as or different from the video signal under processing, or a signal derived from the video signal. The synchronization signal generation processing for generating the external synchronization signal from the external reference signal is well known in the art. The jitter detector 5, which has input terminals for receiving the external and internal synchronization signals, respectively, detects jitter in a time difference between these synchronization signals, and has an output terminal for providing the time difference jitter detected thereby. Since the external synchronization signal essentially has a time difference with the internal synchronization signal, fluctuations in this constant time difference appear as jitter. The time difference jitter is fed back to the external sync signal generator 3 which receives the time difference jitter at its second input terminal. Upon receipt of the time difference jitter, the generator 3 controls the synchronization signal generation processing in a direction in which the time difference jitter is reduced. The position in the generator 3, to which the time difference jitter is fed back, may be at any arbitrary position as long as such a position permits the generator 3 to control the synchronization signal generation processing in the direction in which the time difference jitter is reduced. By repeating the foregoing feedback operation, the time difference jitter is eventually canceled.

Figure 2:
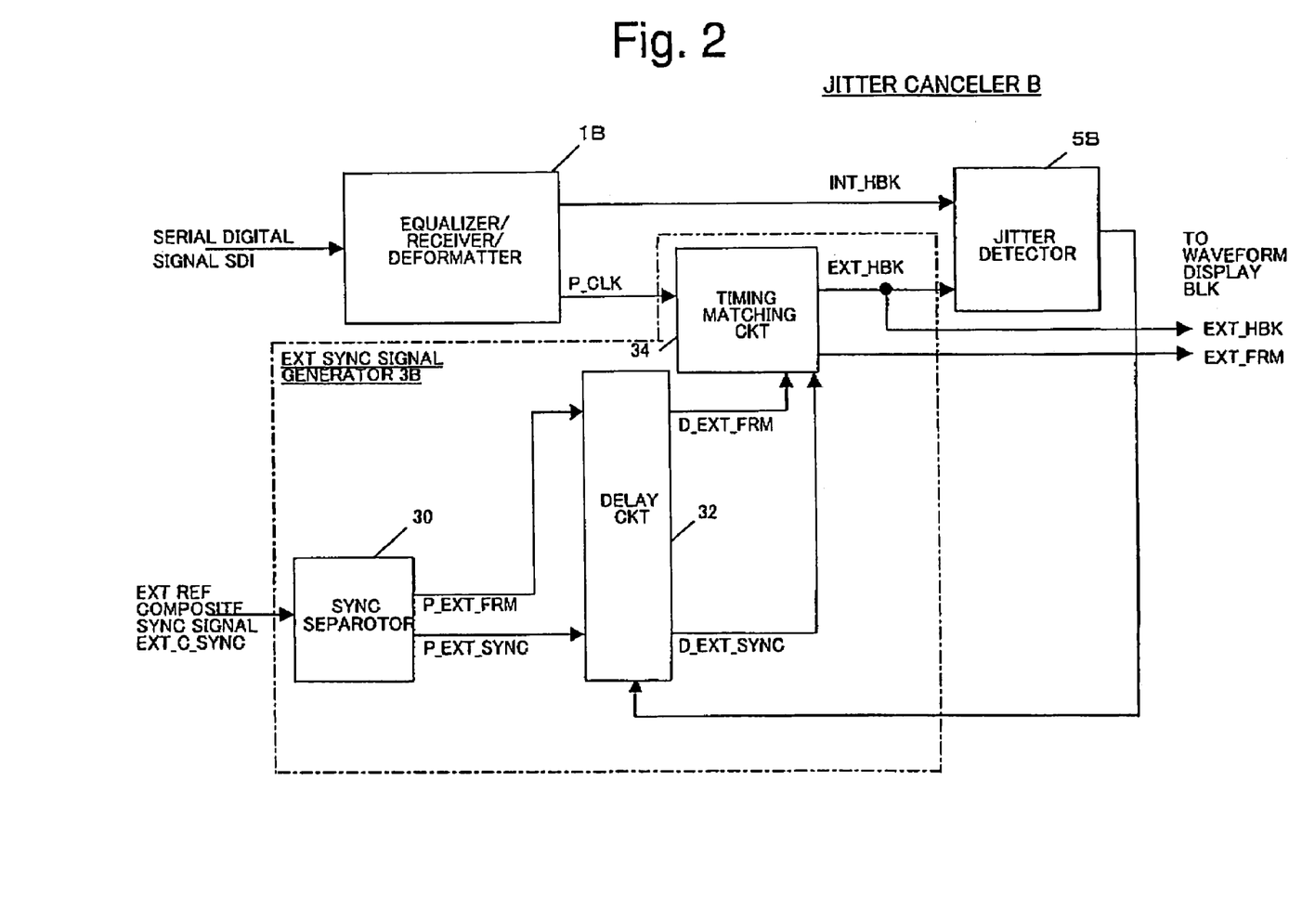
FIG. 2 is a block diagram illustrating a jitter canceler B according to an embodiment of the present invention and is a more detailed illustration of the jitter canceler A in FIG. 1.

Referring next to FIG. 2, description is made of a jitter canceler B according to an embodiment of the present invention and is a more detailed illustration of the jitter canceler A in FIG. 1. In FIG. 2, elements corresponding to those shown in FIG. 1 are designated the same reference numerals with a letter "B" suffixed thereto. As illustrated, the jitter canceler B generally comprises an equalizer/receiver/deformatter 1B, an external synchronization signal generator 3B, and a jitter detector 5B. More specifically, the equalizer/receiver/deformatter 1B, which is a known circuit that receives a serial digital signal SDI, one form of video signal, generates an internal horizontal blanking signal INT_HBK and a parallel clock P_CLK at its output terminals. The external synchronization signal generator 3B in turn receives an external reference composite synchronization signal EXT_C_SYNC, and generates an external horizontal blanking signal EXT_HBK and an external frame synchronization signal EXT_FRM at its output terminals. Here, the external reference composite sync signal is a combination of a horizontal blanking signal and a vertical blanking signal, as is well known in the art. The jitter detector 5B has two input terminals for receiving the internal horizontal blanking signal INT_HBK and external horizontal blanking signal EXT_HBK, respectively, and an output terminal connected to the external sync signal generator 3B.

More specifically, the external sync signal generator 3B comprises a sync separator 30, a delay circuit 32, and a timing matching circuit 34, as illustrated. The sync separator 30, which is a known circuit in the art, separates a primitive external frame synchronization signal P_EXT_FRM and a primitive external horizontal sync signal P_EXT_SYNC from a received composite sync signal, and delivers them to its associated output terminals. The delay circuit 32 has two input terminals for receiving the primitive external signals P_EXT_FRM and P_EXT_SYNC, respectively, and an input terminal for receiving a signal from the jitter detector 5B (for example, a delay selection signal, later described). The delay circuit 32 delays the respective primitive signals P_EXT_FRM and P_EXT_SYNC by an amount depending on the signal from the jitter detector 5B, and delivers the resulting delayed external frame sync signal D_EXT_FRM and delayed external horizontal sync signal D_EXT_SYNC to two output terminals associated therewith, respectively. The timing matching circuit 34, which receives the respective delayed signals D_EXT_FRM, D_EXT_SYNC, also has an input terminal for receiving the parallel clock P_CLK from the equalizer/receiver/deformatter 1B. Then, the timing matching circuit 34 matches the delayed external signals D_EXT_FRM and D_EXT_SYNC with the internal horizontal blanking signal INT_HBK in timing by use of the parallel clock P_CLK, and forms, as a result, an external horizontal blanking signal EXT_HBK and an external frame sync signal EXT_FRM. The timing matching operation essentially involves eliminating a shift in timing between the external reference signal supplied to the sync separator 30 and the serial digital signal SDI received by the equalizer/receiver/deformatter 1B to match them with each other in parallel clock periods. For convenience of explanation, it is assumed in this embodiment that the SDI signal is associated with a high definition television signal (HDTV) which has the frame frequency of 29.97 Hz, horizontal frequency of 33.716 kHz, and vertical frequency of 59.94 Hz (the number of scanning lines is 125, each of which is composed of 2,200 dots). In this case, the parallel clock P_CLK is at 74.1758 MHz. It is assumed also that the external reference composite sync signal is the same as the SDI signal in type or format, i.e., having the horizontal frequency of 33.716 kHz, vertical frequency of 59.94 Hz, and frame frequency of 29.97 Hz. The external horizontal blanking signal EXT_HBK and external frame sync signal EXT_FRM generated in the manner described above are supplied to a waveform display block of, for example, a waveform display device such as a waveform monitor, for example, as trigger signals.

Figure 3:
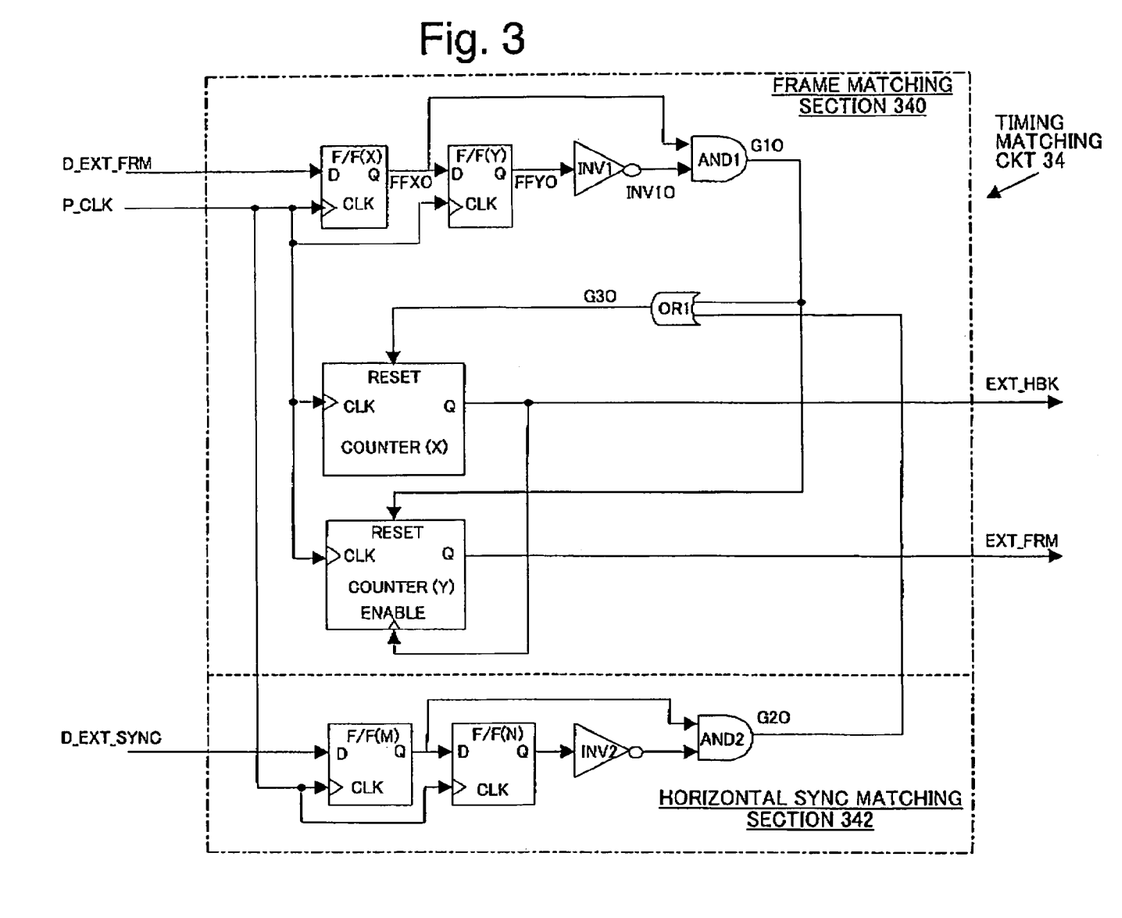
FIG. 3 is a circuit diagram illustrating an embodiment of a timing matching circuit in FIG. 2 in greater detail.

FIG. 3 is a circuit diagram illustrating in detail the timing matching circuit 34 in FIG. 2 according to an embodiment of the present invention. The timing matching circuit 34 comprises two sections, i.e., a frame matching section 340 and a horizontal synch matching section 342. Specifically, the frame matching section 340 comprises two flip-flops F/F(X) and F/F(Y), an inverter INV1, an AND gate (AND1), an OR gate (OR1), and two counters COUNTER(X) and COUNTER(Y).

Figure 4:
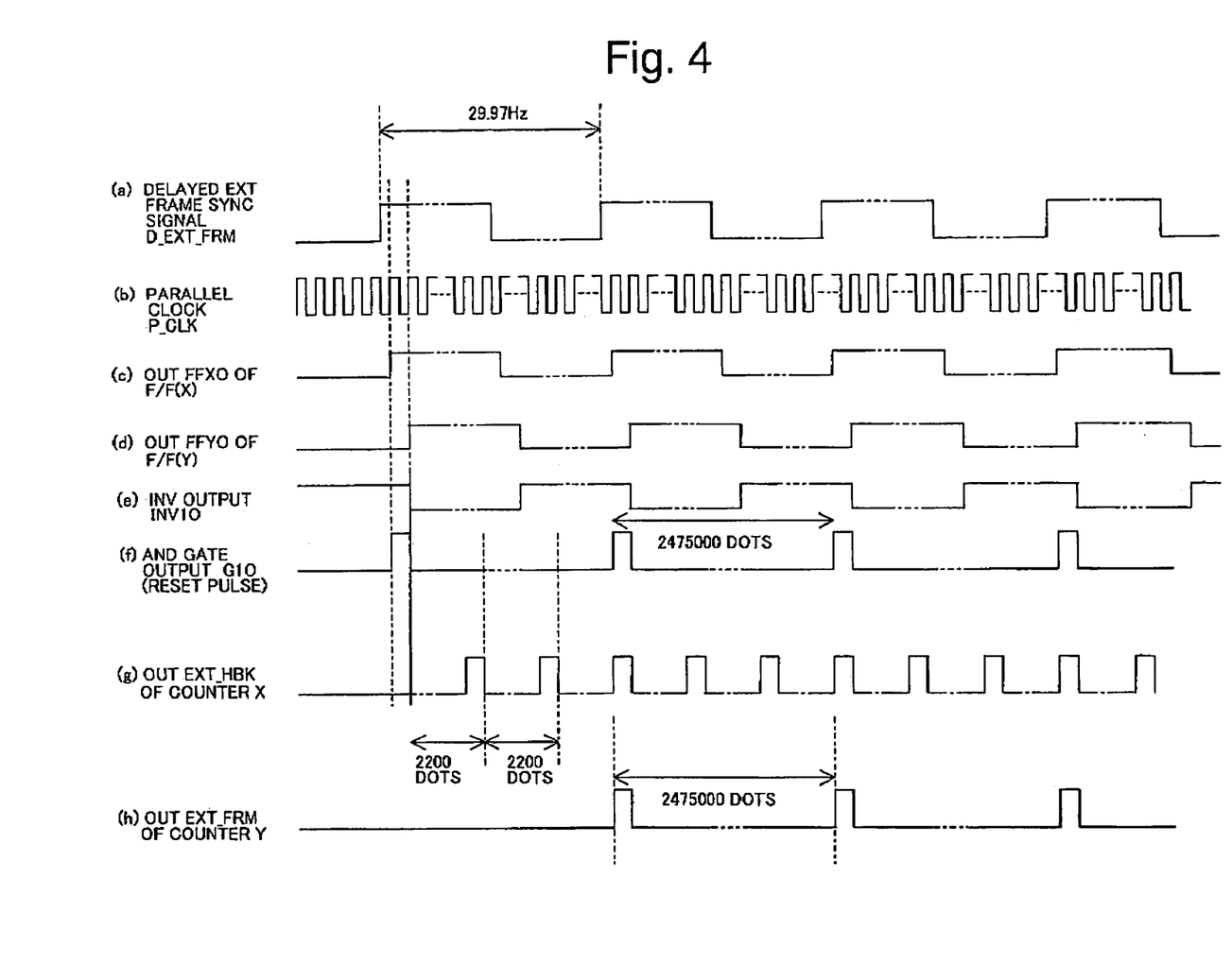
FIG. 4 is a timing chart illustrating waveforms observed at various points in the circuit of FIG. 3.

Referring also to FIG. 4, the first F/F(X) receives the signal D_EXT_FRM ((a) in FIG. 4) at a data input terminal (D), receives the clock P_CLK ((b) in FIG. 4) at a clock input terminal (CLK), and generates an output FFXO ((c) in FIG. 4) at a Q-terminal. The output FFXO may be also referred to as a "sampled synchronization signal." The F/F(X) samples the state of D_EXT_FRM at a rising edge of the clock P_CLK, and generates the sampled state at the Q-terminal as the output FFXO. Next, the F/F(Y) receives the output FFXO at a D-input, receives the clock P_CLK at a clock input, and generates an output FFYO ((d) in FIG. 4) at a Q-terminal. The F/F(Y) operates to delay the output FFXO of the F/F(X) by one full period of the clock P_CLK. The next inverter INV1 inverts the state of the output FFYO, the result of which is generated as an output INV1O ((e) in FIG. 4). Then, the gate AND1 performs an AND operation of the inverted output INV1O with the output FFXO to generate an output G1O ((f) in FIG. 4). The output G1O is supplied to a reset terminal of each of the two counters (X) and (Y) through the gate OR1. Therefore, the gate output G1O serves as a reset pulse. The counter (X), which has a reset terminal (RESET) coupled to an output G3O of the gate OR1 for receiving this reset pulse, receives the clock P_CLK at a clock terminal, and generates the external horizontal blanking signal EXT_HBK ((g) in FIG. 4) at a Q-terminal as its counting result. Specifically, the counter (X) generates the output at high level when it counts 2,200 times, which equal the number of dots on one scanning line, from the time it is reset. Further, the counter (X) returns to zero and again starts counting from zero as it has counted 2,200 times. In this way, the counter (X) generates a pulse at high level each time it counts 2,200 times until it is reset by the next reset pulse, and forms the horizontal blanking signal by repeating these operations. On the other hand, the counter (Y), which likewise has a reset terminal (RESET) coupled to the output G1O of the gate AND1, receives the clock P_CLK at a clock terminal, receives the signal EXT_HBK which is the output of the counter (X) at an enable terminal (ENABLE), and generates the external frame synchronization signal EXT_FRM ((h) in FIG. 4) at a Q-terminal as its counting result. Specifically, the counter (Y) counts the clock P_CLK only when the enable signal is at high level, after it is reset, and generates a high output at the time it has counted a number corresponding to the number of scanning lines in one frame, 1,125 (=1,125×2, 200=1,275,000 dots) in this example.

The frame matching circuit 340 functions even if the SDI signal under processing and the external reference sync signal differ in horizontal frequency as long as they have the same frame frequency. For example, the frame matching circuit 340 functions when the two signals are associated with a standard definition television (SDTV) signal and are of inter-lace scanning type, when one is associated with a standard definition television signal and the other with a high definition television (HDTV) signal, and so forth. It should be noted that the standard definition television signal has the same frame frequency as the high definition television signal.

On the other hand, the horizontal sync matching section 342 is a circuit which functions when the SDI signal has the same horizontal frequency as well as the same frame frequency as the external reference sync signal. Specifically, the horizontal sync matching section 342 comprises two flip-flops F/F(M) and F/F(N), an inverter INV2, and an AND gate (AND2) in the same configuration as the frame matching section 340 comprising the F/F(X) and F/F(Y), INV1, and gate AND1. The horizontal sync matching section 342 differs from the frame matching section 340 in that a second reset pulse is supplied from the gate AND 2 as an output G2O (not shown in FIG. 4) at the period of the signal D_EXT_SYNC rather than the signal D_EXT_FRM, in other words, at the scanning line period rather than the frame period. The second reset pulse and a reset pulse from the gate AND1 are ORed, and the result of the OR operation is supplied only to the counter (X). Therefore, the counter (X) is reset every scanning line period in addition to every frame period, thereby generating the external horizontal blanking signal EXT_HBK which more exactly matches in timing with the external reference signal. As such, the frame matching section 340 is made inoperative when an SDI signal under processing differs from the external reference signal in the horizontal frequency (for example, by keeping the F/F(X) reset). The count values set in the counter (X) and counter (Y) can be changed as appropriate, for example, by changing their counter preset values from a CPU, depending on the type of each video signal associated with an SDI signal under processing and the external reference signal.

Figure 5:
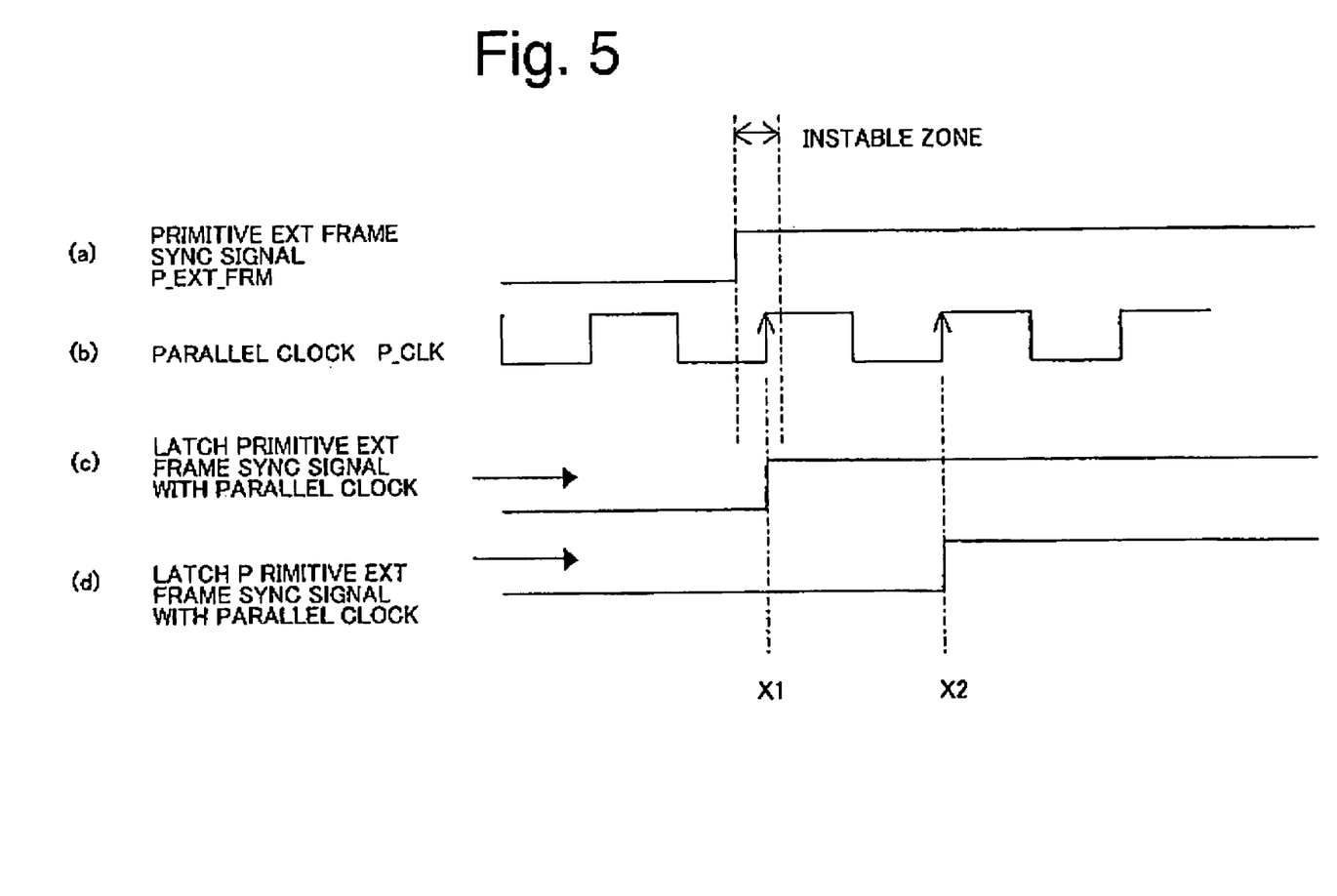
FIG. 5 is a timing chart for explaining prior art problems in the timing matching circuit as illustrated in FIG. 3.

Referring now to FIG. 5, problems left unsolved in the prior art will be described in the timing matching circuit (corresponding to the circuit 34) as illustrated in FIG. 3. Conventionally, the external sync signal generator 3B in FIG. 2 is not provided with the delay circuit 32, so that the primitive frame sync signal P_EXT_FRM ((a) in FIG. 5) is directly supplied to the timing matching circuit. In this case, the flip-flop circuit (corresponding to the F/F(X) in FIG. 3) samples or latches the signal P_EXT_FRM with the parallel clock P_CLK, but this flip-flop requires a certain constant length of set-up time for a stable operation. However, since the phase relationship between the external reference signal and the parallel clock varies due to a delay on a transmission path (devices, cables, and the like), such a set-up time cannot be ensured at all times. In addition, although the signal P_EXT_FRM is drawn in FIG. 5 as a clear waveform which vertically rises, the actual signal tends to rise more gradually. For the reasons set forth above, if the flip-flop circuit latches the signal P_EXT_FRM at time "X1" before the lapse of a set-up time indicated as an "instable zone," the latched signal can rise depending on the actual level of the signal P_EXT_FRM at the time "X1" ((c) in FIG. 5), or the latched signal can remain at low level and rise at the next rising edge of the parallel clock P_CLK ((d) in FIG. 5). This results in a jitter of one parallel clock period. In the waveform chart of FIG. 4, this jitter occurs in FIG. 4, (c), and causes like jitter in all subsequent waveforms in (d) to (h) in FIG. 4. In addition, such jitter will appear in the displayed waveform of the SDI signal. In this embodiment, however, such jitter can be canceled by the action of the jitter detector 5B and delay circuit 32.

Figure 6:
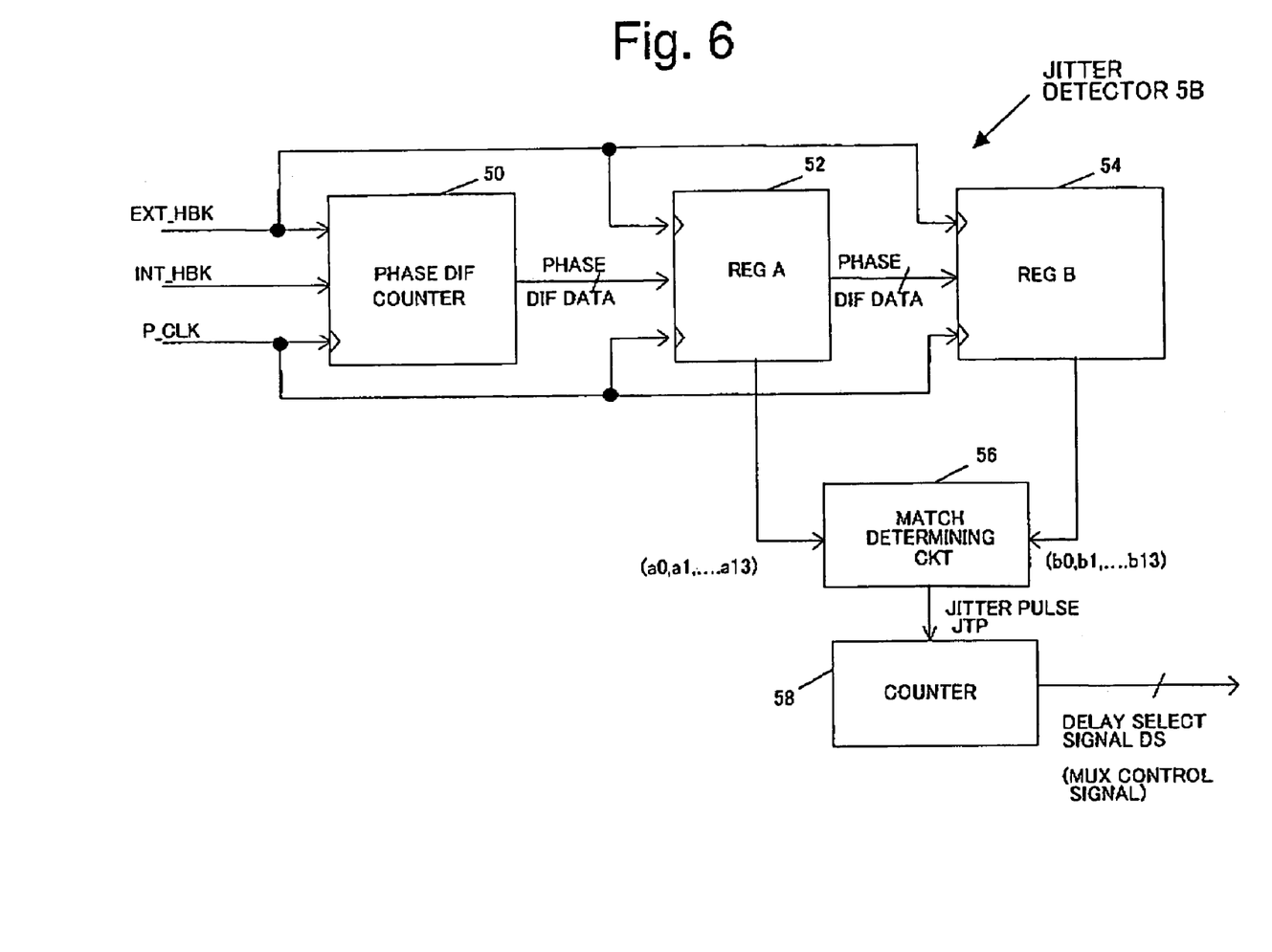
FIG. 6 is a block diagram illustrating in detail the circuit configuration of a jitter detector in FIG. 2 according to an embodiment of the present invention.
Figure 7:
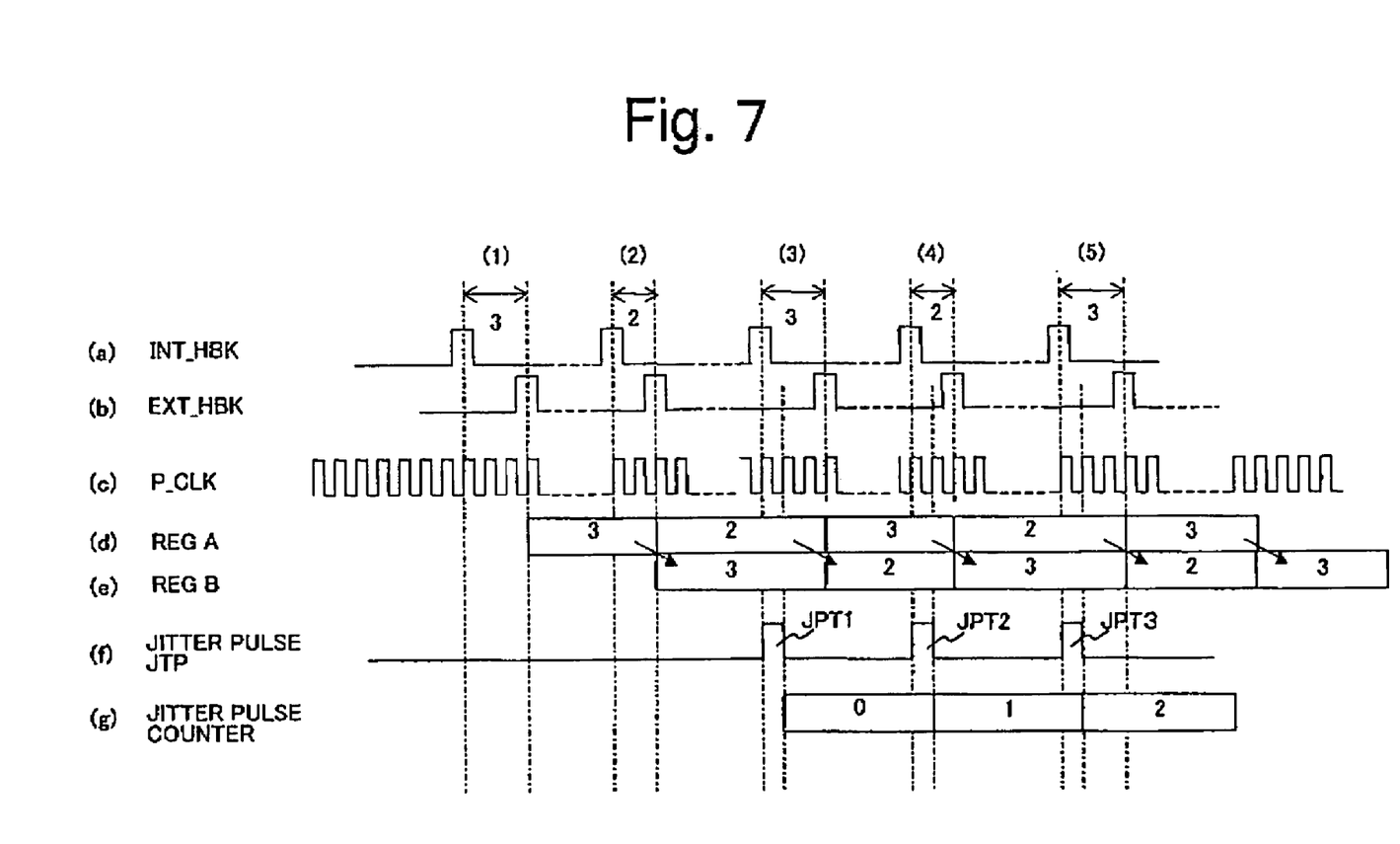
FIG. 7 is a timing chart showing waveforms, data and the like observed at various points in the circuit of FIG. 6.

Now, an embodiment of the jitter detector 5B will be described in detail with reference to FIGS. 6 and 7. The jitter detector 5B illustrated in FIG. 6 comprises a phase difference counter 50, a register A (52), a register B (54), a match determining circuit 56, and a counter 58. Specifically, the phase difference counter 50 receives a signal INT_HBK ((a) in FIG. 7) and a signal EXT_HBK ((b) in FIG. 7), for which a phase difference is detected at two input terminals respectively, receives a parallel clock P_CLK ((c) in FIG. 7) at a clock input terminal, counts the number of clocks P_CLK from the signal INT_KBK to the signal EXT_HBK, and generates the counting result (shown above in (a) in FIG. 7) at its output terminal as phase difference data. In this embodiment, the counter output is comprised of 14 bits. The next register A has an input terminal for receiving the phase difference data from the phase difference counter 50, and receives the signal EXT_HBK at an enable terminal and also receives the clock P_CLK at a clock terminal, captures the phase difference data from the counter 50 when the trigger signal is at high level and the parallel clock P_CLK is rising, and simultaneously delivers the preceding phase difference data to its output terminal. The captured phase difference data is delivered to another output terminal as phase difference data a0-a13 ((d) in FIG. 7) in parallel. Simultaneously, the register B operates in a manner similar to the register A (note that the register B is not a subsequent register) except that the register B receives the phase difference data a0-a13 from the register A, and delivers them in parallel as phase difference data b0-b13 ((e) in FIG. 7). The next match determining circuit 56 has two input terminals for receiving the phase difference data a0-a13 from the register A and the phase difference data b0-b13 from the register B to determine whether or not there is a match or an unmatch therebetween. If there is an unmatch, the match determining circuit 56 delivers a jitter pulse JTP ((f) in FIG. 7) at its output terminal. The jitter pulse JTP remains at high level during one clock period of the parallel clock P_CLK which starts while the signal INT_HBK is at high level. The counter 58, which has an input terminal for receiving the jitter pulse JTP, counts the number of the jitter pulses JTP, and delivers the counting result to its output terminal as a delay selection signal DS. The delay selection signal DS is a signal for selecting the amount of delay proportional to the magnitude of the count. Therefore, the jitter detector 5B detects whether there is a match or an unmatch during every constant time period substantially corresponding to the horizontal blanking period, and increases the amount of delay by increasing the counted value as long as an unmatch remains detected, and stops increasing the amount of delay at a time the unmatch is no longer detected. In this embodiment, the counter 58 is an up-counter which returns to zero as it reaches its maximum count value and again starts the up-counting operation.

Figure 8:
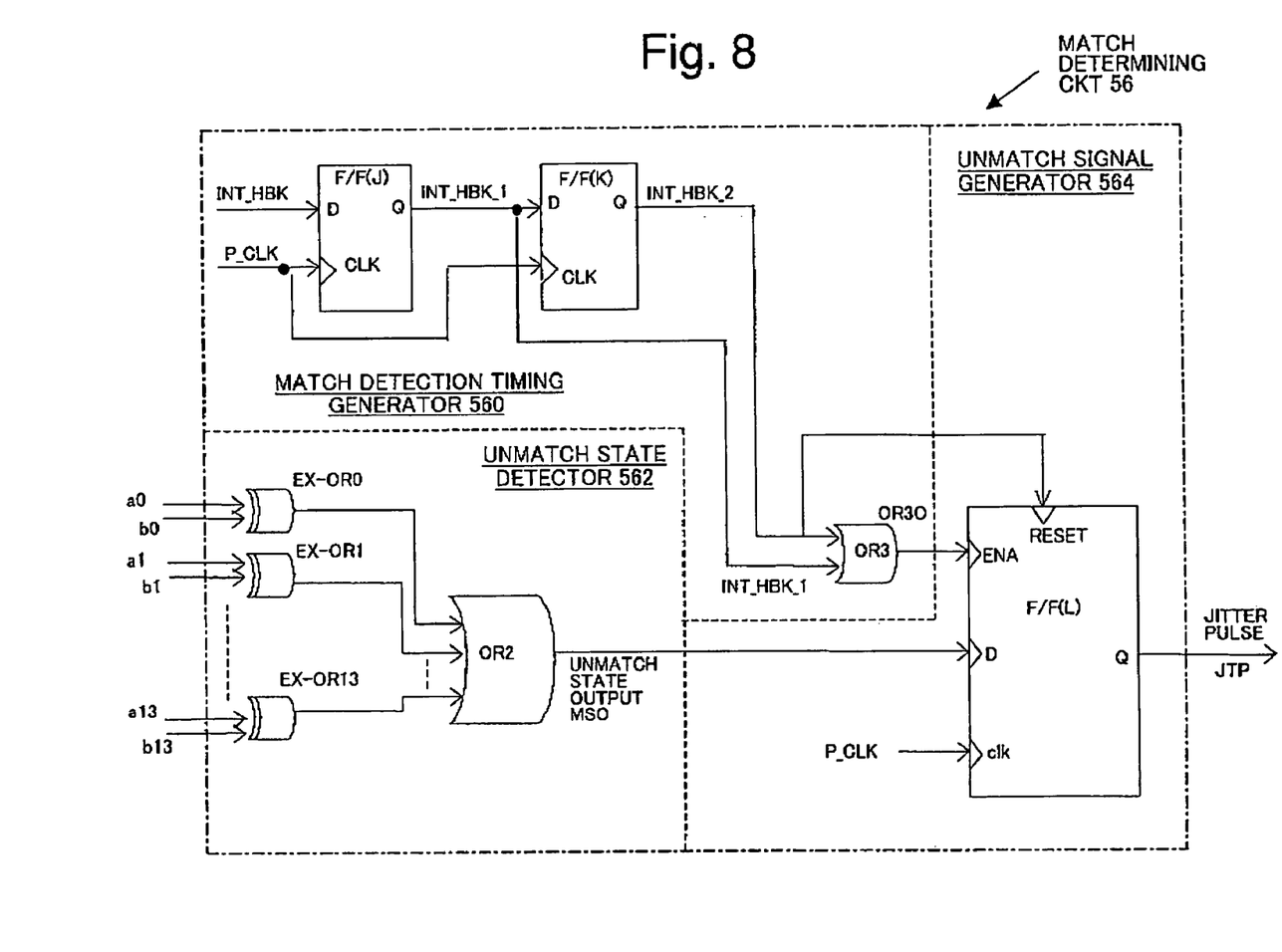
FIG. 8 is a circuit diagram illustrating in detail the circuit configuration of a match determining circuit in FIG. 6 according to an embodiment of the present invention.
Figure 9:
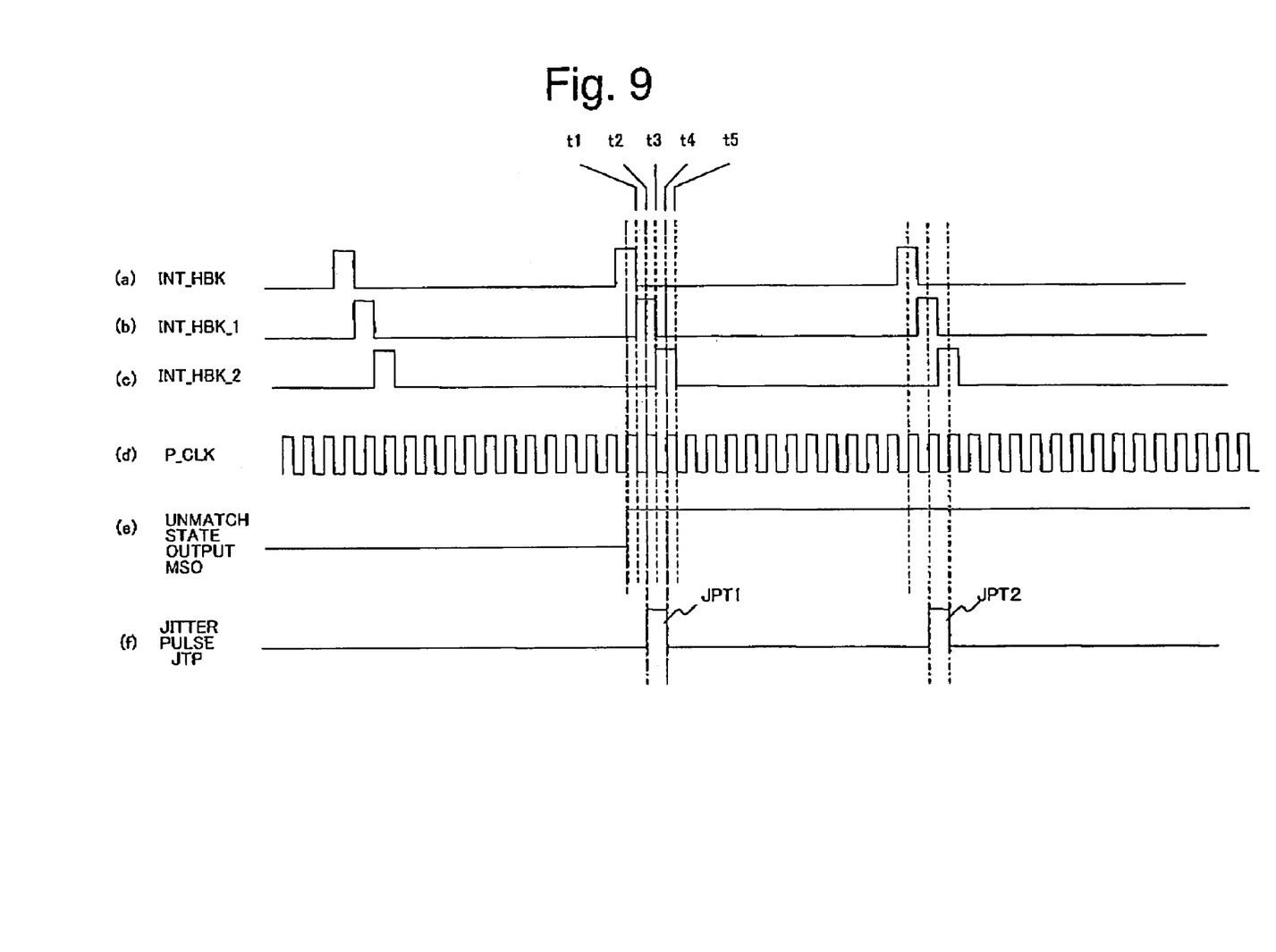
FIG. 9 is a timing chart illustrating waveforms observed at various points in the circuit of FIG. 8.

Referring next to FIGS. 8 and 9, an embodiment of the match determining circuit 56 in FIG. 6 will be described in greater detail. FIG. 9 shows part of a time period in the waveform chart of FIG. 7 in greater detail. As illustrated in FIG. 8, the match determining circuit 56 is made up of three sections, i.e., a match detection timing generator 560, an unmatch state detector 562, and an unmatch signal generator

564. First, the match detection timing generator 560 comprises two flip-flops F/F(J) and F/F(K), and an OR gate (OR3). The F/F(J) receives the clock P_CLK at its clock terminal, and delays an internal horizontal blanking signal INT_HBK ((a) in FIG. 9) received at its data input terminal by one clock to generate a signal INT_HBK_1 ((b) in FIG. 9) which is delivered to its Q-terminal. The F/F(K) also receives the clock P_CLK at its clock terminal and the signal INT_HBK_1 at its data input terminal, and delays the signal INT_HBK_1 by one clock to generate a signal INT_HBK_2 ((c) in FIG. 9) which is delivered to its Q-terminal. The gate OR3, which receives two signals INT_HBK_1 and INT_HBK_2, performs an OR operation of these signals to generate an output OR3O which is at high level for two parallel clocks. This output OR3O determines a match detection timing. In the exemplary waveforms of FIG. 7, the timing at which the detection is made as to whether phase difference data "2" in a horizontal period (2) matches with phase difference data "3" in a horizontal period (3), should fall within a time period of two parallel clocks immediately after INT_HBK in the horizontal period (3).

The unmatch state detector 562 comprises 14 exclusive OR gates EX-OR0-EX-OR13 and a single OR gate (OR2). While the gates EX-OR0-EX-OR13 receive the 14-bit phase difference data a0-a13 from the register A and 14-bit phase difference data b0-b13 from the register B in FIG. 6, respectively, each gate is connected to receive a pair of corresponding bits such as bit a0 and b0, a1 and b1, and the like. In this way, each of the gates EX-OR generates a high output only when there is an unmatch between both input bits. The OR gate (OR2), which receives the outputs of these gates EX-OR at a plurality of input terminals, performs an OR operation of the received outputs to generate an unmatch output MSO ((e) in FIG. 9) which goes high when at least one of the outputs of the gates EX-OR0-EX-OR13 is at high level, in other words, when there is an unmatch in the phase difference data between adjacent horizontal periods. Then, the unmatch signal generator 564 comprises a single flip-flop F/F(L) which receives the unmatch output MSO at its data input terminal, receives the clock P_CLK at its clock terminal, receives the output OR3O at its enable terminal (ENA), and receives INT_HBK_2 at its reset terminal. With the foregoing configuration, the F/F(L) is enabled by the output OR3O, for example, from time t1 to time t5 immediately after each INT_HBK, and latches the unmatch output MSO at the rising edge of the first clock P_CLK during the enabled time period, and delivers the unmatch output MSO to its Q-terminal. Subsequently, the F/F(L) is reset at a rising edge of the clock P_CLK while the signal INT_HBK_2 at the reset terminal is at high level, i.e., at time t4. In this way, the unmatch signal generator 564 generates jitter pulses JTP1, JTP2, and the like which are at high level for one full clock P_CLK every horizontal period when the unmatch output MSO is at high level, indicating that there is unmatch. When the unmatch output MSO is at low level, the F/F(L) does not deliver the jitter pulse from its output.

Turning back to FIG. 7, as long as the phase difference data in the register A is different from the phase difference data in the register B, i.e., as long as the phase difference continues to fluctuate between adjacent horizontal periods, such as different phase difference data "3" and "2" found in the horizontal periods (1) and (2); different phase difference data "2" and "3" found in the horizontal periods (2) and (3); different phase difference data "3" and "2" found in the horizontal periods (3) and (4); and different phase difference data "2" and "3" found in the horizontal periods (4) and (5), the unmatch output MSO remains at high level, resulting in the generation of the jitter pulses JPT1, JPT2, JPT3 ((f) in FIG. 7) in the respective horizontal periods. The counter 58 in FIG. 6, which receives the jitter pulses from the match determining circuit 56, counts the received jitter pulses, and delivers the result ((g) in FIG. 7) as the delay selection signal DS. In the foregoing manner, the jitter detector 5B forms the delay selection signal DS which continuously increases the amount of delay as long as the jitter is continuously detected in the time difference between the signals INT_HBK and EXT_HBK.

Figure 10:
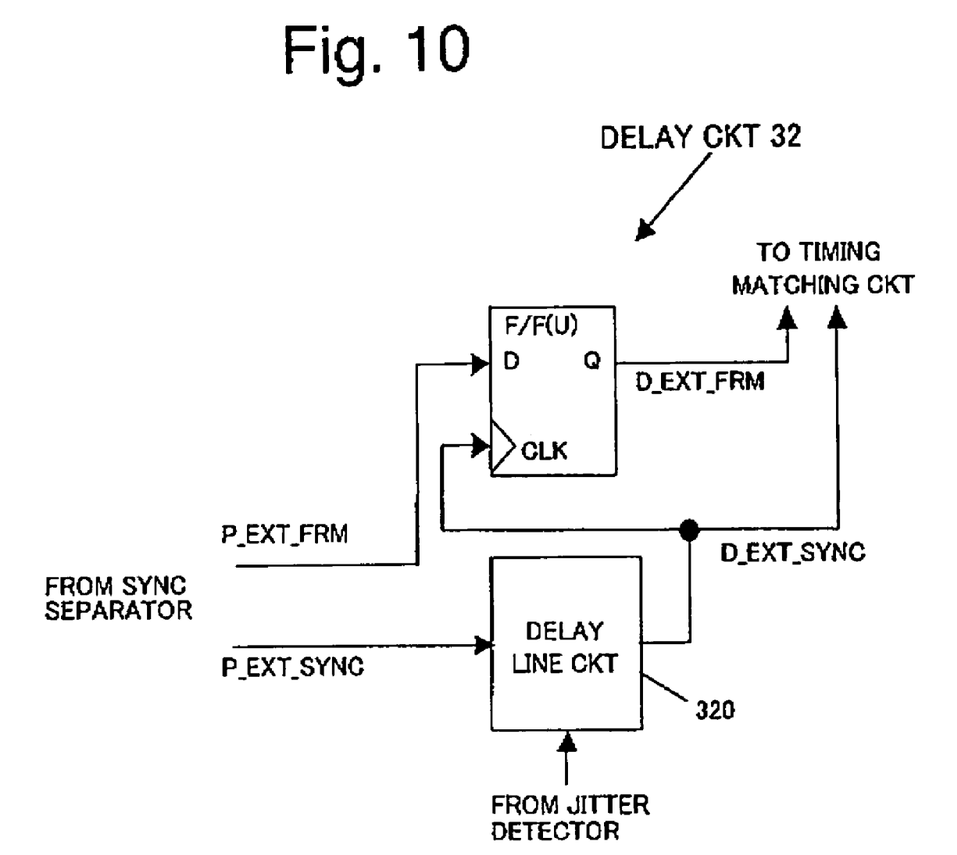
FIG. 10 is a block diagram illustrating in detail the circuit configuration of a delay circuit in FIG. 2 according to an embodiment of the present invention.
Figure 11:
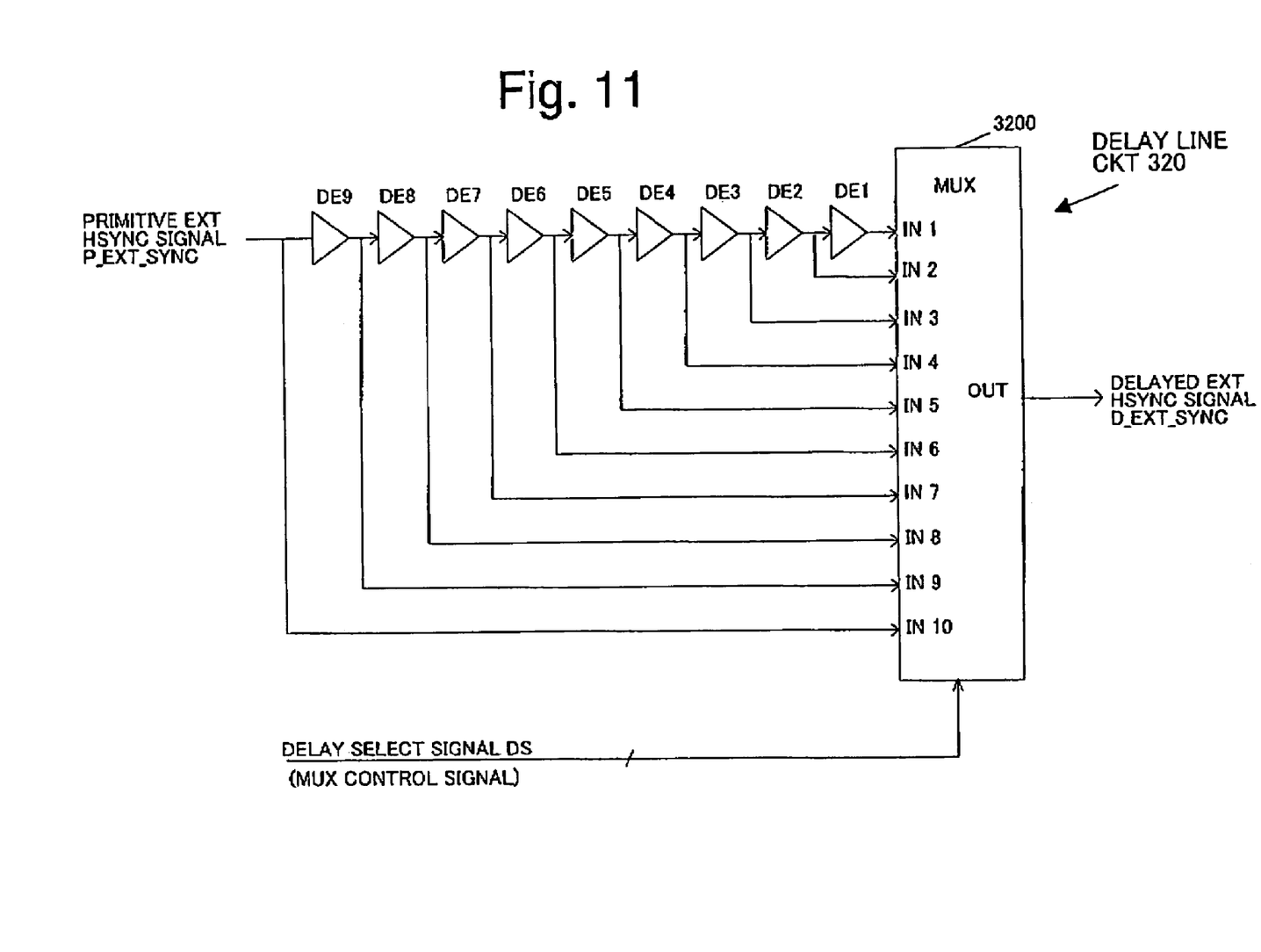
FIG. 11 is a circuit diagram illustrating in detail the circuit configuration of a delay line circuit in FIG. 10.

Referring now to FIGS. 10 and 11, an embodiment of the delay circuit 32 in FIG. 2 will be described in greater detail. As illustrated in FIG. 10, the delay circuit 32 comprises a delay line circuit 320, and a flip-flop F/F(U). Specifically, the delay line circuit 320 has an input terminal for receiving the signal P_EXT_SYNC from the sync separator 30 in FIG. 2, has an input terminal for receiving the delay selection signal DS from the jitter detector 5B, and delays the received signal P_EXT_SYNC by the amount of delay specified by the delay selection signal DS to generate a resulting delayed signal D_EXT_SYNC at its output. The F/F(U) is connected to receive the delayed external sync signal D_EXT_SYNC at its clock terminal and to receive the signal P_EXT_FRM from the sync separator 30. With this configuration, the F/F(U) can provide the signal P_EXT_FRM with the same amount of delay as that in the delay line circuit 320, and generate a resulting delayed external frame sync signal D_EXT_FRM at its Q-terminal. The employment of the configuration in FIG. 10 allows a required delay to be provided with a reduced number of delay lines.

FIG. 11 illustrates an embodiment of the delay line circuit 320 in FIG. 10 in greater detail. As illustrated, the delay line circuit 320 comprises a plurality of, for example, nine delay elements DE1-DE9 connected in series, and a multiplexer 3200. Specifically, an input end of a series connection of the delay elements is connected to receive the primitive external horizontal sync signal P_EXT_SYNC. The multiplexer 3200 in turn has input terminals 1-9 connected to outputs of the delay elements DE1-DE9 associated therewith, and also has an input terminal 10 connected to receive the signal P_EXT_SYNC at the input end. Also, the multiplexer 3200 has a control input terminal for receiving the delay selection signal DS, so that the multiplexer 3200 connects one of the input terminals 1-10 to its output terminal in response to the delay selection signal DS to form the delayed external horizontal sync signal D_EXT_SYNC. Here, when the delay selection signal DS specifies an increase in the amount of delay, the input terminal selected for connection to the output terminal of the multiplexer 3200 is shifted in a direction from the input terminal 10 to the input terminal 1. Then, after the input 1 which provides the largest amount of delay, the input 10 which provides no delay is selected again.

Figure 12:
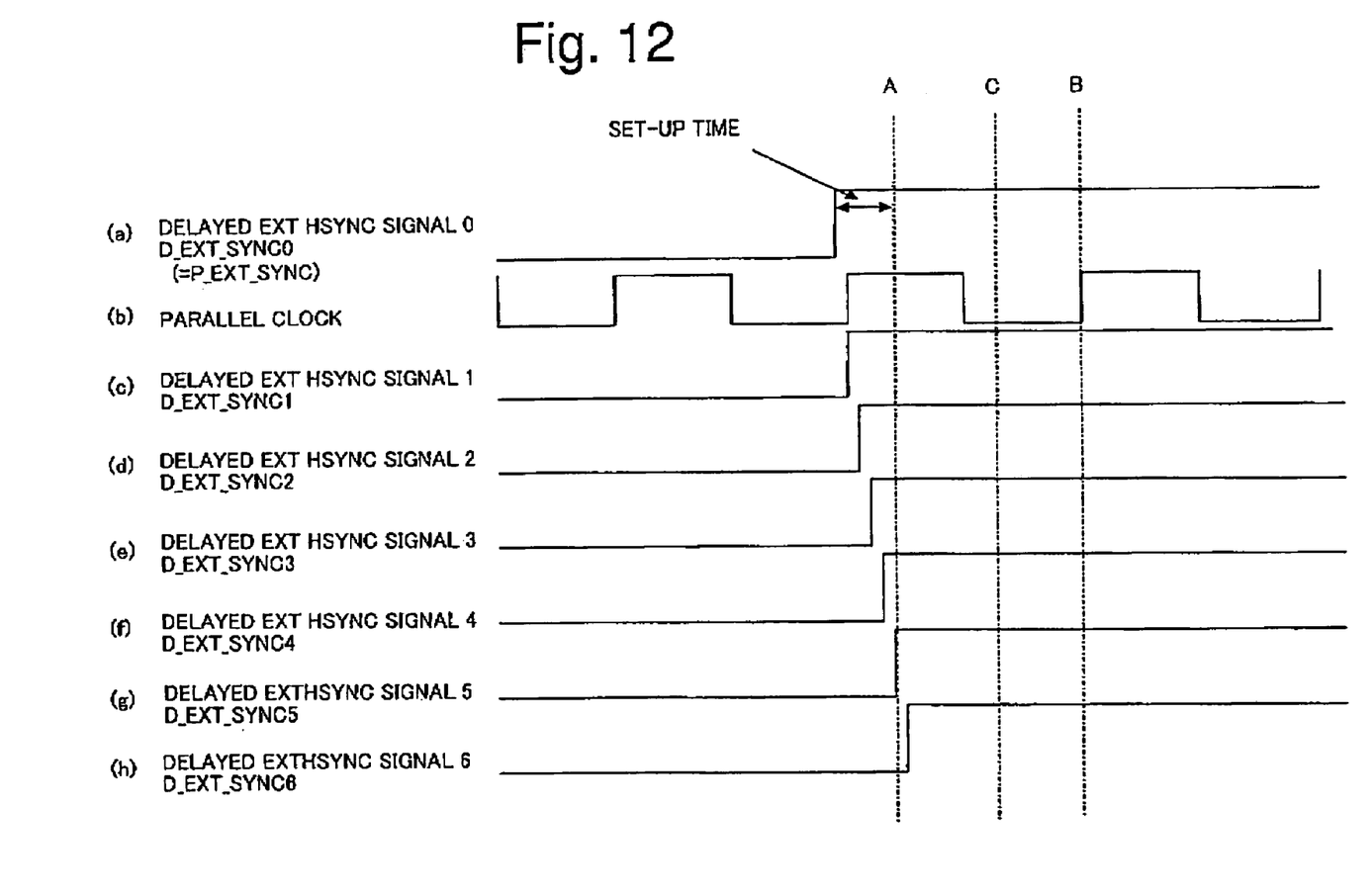
FIG. 12 is a timing chart for explaining the operation of the delay circuit in FIG. 10.

Referring next to FIG. 12, the operation of the delay circuit 32 will be described. Initially, the delay circuit 32 is set to select a signal with no delay, i.e., the delayed external signal D_EXT_SYNC0 ((a) in FIG. 12) equal to the primitive external horizontal sync signal. In this state, it is assumed that the primitive external horizontal sync signal and the parallel clock are in a phase relationship as shown, i.e., the time difference between a rising edge of the primitive external horizontal sync signal and the rising edge of the parallel clock is at a position as shown within the set-up time of the F/F(X) in FIG. 3. In this case, since no stable sampling operation is expected as described in connection with FIG. 5, the jitter detector 5B generates a jitter pulse. Upon receipt of one jitter pulse, the delay circuit 32 generates a delay of one unit delay amount, i.e., generates a slightly delayed signal D_EXT_SYNC1 ((c) in FIG. 12) by switching from the input terminal 10 to the input terminal 9 of the multiplexer 3200. However, since the time difference is still less than the set-up time, another jitter pulse is generated, causing the delay circuit 32 to add another unit delay, i.e., to switch from the input terminal 9 to the input terminal 8 to generate a further delayed signal D_EXT_SYNC2 ((d) in FIG. 12). In this way, the delay circuit 32 sequentially increases the amount of delay to ensure a sufficient set-up time with a delayed signal D_EXT_SYNC6 which rises after time A, so that the jitter detector 5B will not generate more jitter pulses under the same condition. Here, the maximum delay provided by the delay circuit 32 may be sufficient if it can implement a delay not more than one period of the parallel clock, i.e., a delay close to time B. However, depending on the quality of the reference signal, or the like, the operation may not be stabilized before a delay close to time C, so that the shown set-up time should be regarded as a mere example.

A variety of modifications can be made to the embodiments of the present invention described above in detail. First, while in the foregoing embodiments, the jitter is detected and reduced in horizontal periods, such operations can be performed every predetermined time period other than the horizontal period, for example, in frame periods. Second, while the foregoing embodiments have been described in connection with an HDTV signal, the present invention can be applied as well to an SDTV signal, and can also be applied to interlace and non-interlace television signals. Third, the external reference signal used in the present invention can be different in type from a video signal under processing, as previously mentioned. Fourth, the position in the external sync signal generator 3, to which the time difference jitter is fed back from the jitter detector 5B, may be changed to another arbitrary position as long as a similar function can be implemented. The resolution of the delay provided by the delay circuit 32 may be changed as required. In addition, the delay circuit 32 may be composed of other elements, for example, flip-flops, instead of delay lines. Further, while the foregoing embodiments have been described in connection with a synchronization signal for which jitter is detected, the present invention can be applied to any other arbitrary trigger signal associated with a video signal. Finally, while the foregoing embodiments refer to a waveform display device such as a waveform monitor as a video signal processing apparatus, the present invention can be used in other video signal processing apparatuses (for example, a switcher).

According to the present invention described above, the jitter canceling operation can eliminate a phase shift in an overall video signal, even when an internal synchronization signal is switched to an external synchronization signal, and vice versa, for use in the processing of the video signal. Also, a variety of video signals can be strictly matched with a reference signal in a studio or the like, thereby improving the quality of a resulting edited signal. Further, even if the definition of a reference signal for synchronization differs from one studio to another, the jitter canceling operation permits the production and editing of video signals without phase shift. Moreover, the video signal can be less affected by the performance of the timing matching circuit (particularly, the length of set-up time, and fluctuations in the set-up time).

What is claimed is:

1. A jitter canceling method comprising the steps of:
    detecting jitter in a time difference between a first synchronization signal and a second synchronization signal;
    reducing said time difference jitter by controlling an amount of delay of said second synchronization signal in response to said time difference jitter,
    said step of detecting jitter including;
        detecting a phase difference of said second synchronization signal relative to said first synchronization signal in certain time periods; and
        determining whether or not said phase difference is the same in two adjacent said time periods to generate an unmatch signal when said phase difference is not the same.

2. A jitter canceling method according to claim 1, wherein the step of reducing said time difference jitter includes the steps of:
    generating a primitive second synchronization signal from a reference signal;
    delay said primitive second synchronization signal by a selected amount of delay to generate a delayed second synchronization signal; and
    matching said delayed second synchronization signal with said first synchronization signal in timing to generate said second synchronization signal.

3. A jitter canceling method according to claim 2, wherein said step of delaying includes:
    generating a plurality of delayed second synchronization signals having different amounts of delay; and
    selecting one delayed second synchronization signal having said selected amount of delay from said plurality of delayed second synchronization signals.

4. A jitter canceling method according to claim 2, wherein said step of matching uses a reference clock associated with said first synchronization signal.

5. A jitter canceling method according to claim 4, wherein said step of matching said delayed synchronization signal with said first synchronization signal in timing includes:
    sampling said delayed second synchronization signal based on said reference clock to generate a sampled synchronization signal; and
    generating said second synchronization signal which matches with said first synchronization signal in timing based on said sampled synchronization signal.

6. A jitter canceling method according to claim 2, wherein said step of detecting jitter includes:
    counting the number of said unmatch signals to generate a delay selection signal for specifying said selected amount of delay in accordance with the result of the counting.

7. A jitter canceling method according to claim 6, wherein said step of reducing time difference jitter includes the step of increasing or decreasing said selected amount of delay in response to said delay selection signal.

8. A jitter canceling method according to claim 7, wherein said selected amount of delay is increased or decreased each time by a unit mount of delay.

9. A jitter canceling method according to claim 7, wherein said selected amount of delay is initially set to be equal to zero.

10. A jitter canceling method according to claim 1, wherein:
    said first synchronization signal is an internal synchronization signal generated from a video signal; and
    said second synchronization signal is an external synchronization signal generated from a reference signal.

11. A jitter canceling method according to claim 1, wherein said second synchronization signal comprises a trigger signal.

12. A jitter canceling apparatus comprising:
    a time difference jitter detector connected to receive a first synchronization signal and a second synchronization signal and detecting jitter in a time difference between said first and second synchronization signals to generate a time difference jitter signal indicative of the time difference jitter; and
    a delay circuit connected to receive said time difference jitter signal and reduce said time difference jitter by controlling an amount of delay of said second synchronization signal in response to said time difference jitter signal;

said time difference jitter detector including:

a phase difference detector detecting a phase difference of said second synchronization signal relative to said first synchronization signal in certain time periods; and a match detector determining whether or not said phase difference is the same in two adjacent said time periods to generate an unmatch signal when said phase difference is not the same.

13. A jitter canceling apparatus according to claim 12, wherein said delay circuit includes:

a synchronization signal generator receiving a reference signal to generate a primitive second synchronization signal;

a delay signal generator generating from said primitive second synchronization signal a plurality of delayed second synchronization signals having different amounts of delay; and a selector connected to receive said plurality of delayed second synchronization signals and selecting one delayed second synchronization signal having a selected amount of delay from said plurality of delayed second synchronization signals, and wherein said jitter canceling apparatus further includes a timing matching circuit generating from said delayed second synchronization signal said second synchronization signal which is matched with said first synchronization signal in timing.

14. A jitter canceling apparatus according to claim 13, wherein said plurality of delayed second synchronization signals are different one after another by a unit amount of delay.

15. A jitter canceling apparatus according to claim 13, wherein said delay circuit includes delay lines.

16. A jitter canceling apparatus according to claim 13, wherein said timing matching circuit uses a reference clock associated with said first synchronization signal.

17. A jitter canceling apparatus according to claim 16, wherein said timing matching circuit includes:

a sampling circuit sampling said delayed second synchronization signal based on said reference clock to generate a sampled synchronization signal; and a generator generating said second synchronization signal matched, with said first synchronization signal in timing based on said sampled synchronization signal.

18. A jitter canceling apparatus according to claim 16, wherein said selected amount of delay by which said primitive second synchronization signal is delayed has a maximum of less than one period of said reference clock.

19. A jitter canceling apparatus according to claim 13, wherein said time difference jitter detector further comprises:

a counter circuit counting the number of said unmatch signals to generate a delay selection signal for specifying said selected amount of delay in accordance with the result of the counting, thereby increasing or decreasing said selected amount of delay in response to said delay selection signals.

20. A jitter canceling apparatus according to claim 19, wherein said selected amount of delay is increased or decreased each time by a unit delay.

21. A jitter canceling apparatus according to claim 19, wherein said selected amount of delay is initially set to be equal to zero.

22. A jitter canceling apparatus according to claim 12, wherein:

said first synchronization signal is an internal synchronization signal generated from a video signal; and said second synchronization signal is an external synchronization signal generated from a reference signal.

23. A jitter canceling apparatus according to claim 12, wherein said time period is a frame period or a horizontal period.

24. A jitter canceling apparatus according to claim 12, wherein said synchronization signals comprise a frame signal or a horizontal synchronization signal.

25. A jitter canceling apparatus according to claim 22, wherein said external reference signal is a video signal of the same type as or different from said video signal, and is associated with said first synchronization signal.

26. A video signal processing apparatus comprising the jitter canceling apparatus according to claim 12.

27. A video signal processing apparatus according to claim 26, wherein said video signal processing apparatus is a waveform monitor.

* * * * *